Dec. 2, 1969 F. HUGLE 3,481,801

ISOLATION TECHNIQUE FOR INTEGRATED CIRCUITS

Filed Oct. 10, 1966

INVENTOR.

Francis Hugle

United States Patent Office 3,481,801

Patented Dec. 2, 1969

3,481,801

ISOLATION TECHNIQUE FOR INTEGRATED CIRCUITS

Frances Hugle, Santa Clara, Calif., assignor to Frances Hugle, as trustee of Frances Hugle Trust Filed Oct. 10, 1966, Ser. No. 585,351

Int. Cl. H01l 7/00

U.S. Cl. 148—175 4 Claims

ABSTRACT OF THE DISCLOSURE

A simplified method of isolating components of integrated circuits. As an example, into plural areas of a P type substrate an N+ diffusion is accomplished, after which an epitaxial P layer is grown. During this time up-diffusion from the prior N+ diffusion gives an N diffusion atop the N+ diffusion. The growth of the P epitaxial layer is stopped before the N up-diffusion is converted to P type material. P type isolation is thus secured. Further P and N+ diffusions may be successively accomplished to successively provide a base and an emitter for a transistor in the volume of the N diffusion of each of the plural areas.

This invention comprises a method of manufacturing epitaxial integrated circuits which requires fewer operations than the techniques used heretofore while allowing certain improvements in the end product.

The invention itself, as well as the advantages over the prior art, will be best understood by reference to the drawings.

Figure 1:
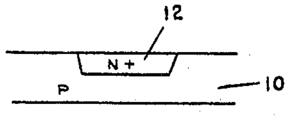
FIGURE 1 shows a P type starting semiconductor wafer 10 with a selective N+ "buried layer" diffusion 12.
Figure 2:
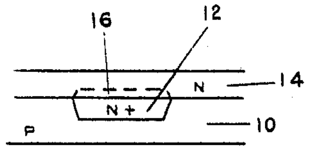
FIGURE 2 shows the same wafer with an N type epitaxial layer 14 grown upon it. The outdiffusion 16 of the buried layer is also shown.
Figure 3:
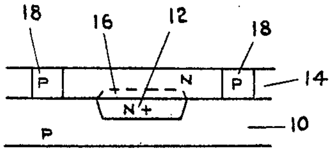
FIGURE 3 shows the same wafer after the P type isolation diffusion 18.

The "state-of-the-art" integrated circuit is formed by selectively diffusing an N+ layer 12 into one side of a P type semiconductor wafer 10 (FIGURE 1) and growing an epitaxial layer 14 on the same side of this wafer, said epitaxial layer being doped with an N type impurity such as phosphorus, arsenic, or antimony to a level determined by the collector-base breakdown voltage required in the circuit, typically around .5 ohm cm. During the epitaxial deposition, the N+ areas previously diffused, diffuse up 16 into the epitaxial layer, so that the areas over the "buried layers" 12 have a lower resistivity than the areas between and these lower resistivity regions are graded, being most lightly doped near the surface (FIGURE 2). In order to achieve an adequate thickness of proper resistivity material above the buried layer, the total layer thickness is usually 8 to 12 microns. Isolation is achieved by a P diffusion 18 between the regions with the buried layers (FIGURE 3). This diffusion must extend into the P type substrate so it is a fairly long high temperature diffusion. During this diffusion, the dopant in the buried layer diffuses farther up 16 into the epitaxial material.

Also the P diffusion 18 moves laterally as far as it does vertically, so a space greater than twice the thickness of the epitaxial layer must be allowed for the isolation diffusion. Because of this lateral spread, isolation may take up to as much as 40 percent of the area in an integrated circuit.

Figure 5:
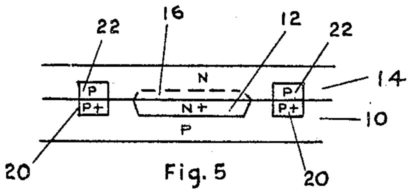
FIGURE 5 shows the same wafer after the N epitaxial layer 14 has been grown. The outdiffusion of both buried diffusions 16, 22 is shown.
Figure 6:
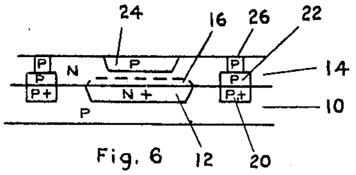
FIGURE 6 shows the same wafer after the simultaneous base transistor 24 and base isolation 26 diffusion.
Figure 4:
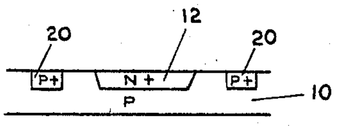
FIGURE 4 shows an alternate to FIGURE 1, incorporating a buried P isolation diffusion 20 as well as the buried N+ diffusion 12.

Another procedure sometimes used is to bury a P+ isolation diffusion 20 as well as the N+ islands 12 before the epitaxial layer 14 is grown (FIGURE 4). The N+ diffusion 12 is a slow diffusing impurity and the P+ (20) is a faster diffusant. When the epitaxial layer 14 is grown both buried layers diffuse up into the new layer, the P (22) moving farther than the N (16). The epitaxial layer 14 is N doped as before (FIGURE 5). When the P type diffusion is done to form the bases 24 of the transistors, P material 26 is concurrently diffused above the buried isolation 20 and the two P regions join to effect isolation (FIGURE 6). This technique permits thinner epitaxial layers, 5 to 8 microns, and does not require quite as much isolation area but it produces a new problem. The presence of high concentrations of P impurities outgassing from the substrate during the growth of the epitaxial layer can cause spurious P layers in the supposedly N regions. These "phantom" P layers are hard to control and when present may ruin the circuit performance.

Both present techniques require a masking operation and a diffusion for the sole purpose of isolation.

It is an object of this invention to eliminate isolation diffusion, and the associated masking operation, entirely. It is a further object to minimize the area devoted to isolation. It is a further object to reduce the thickness of the epitaxial layer. This is especially important in switching circuits where the buk volume of the collector region affects collector storage and switching speed. Corrollary advantages of a thinner epitaxial layer are lower transistor saturation resistance and faster (cheaper) epitaxial processing.

Starting with a P type substrate 10 as before, diffuse a slow N diffusant to form the buried layers 12, as before, but leaving less space between the N+ areas than previously. Next grow a layer of epitaxial material 28 which is doped with a P type impurity instead of N. The concentration of P impurity can vary over wide limits, the more highly concentrated, the thinner the epitaxial layer can (and must) be. A good value might be a concentration that, in the absence of compensating N impurities, would grow .3 ohm cm. P type material. As the layer grows, it will be P type in the regions that do not have an N+ diffusion under them, thus eliminating the conventional "isolation" steps.

Figure 7:
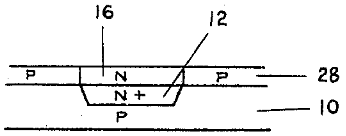
FIGURE 7 shows a wafer made according to this invention after only one diffusion and the epitaxial layer.
Figure 8:
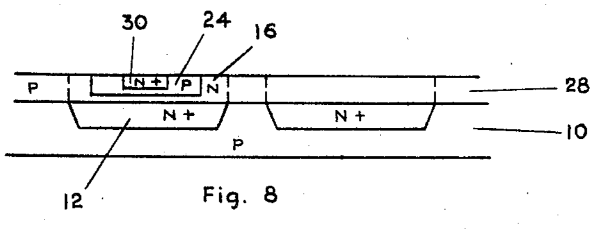
FIGURE 8 shows two isolated transistors made according to the teaching of this invention.

Over the buried layers, the up diffusing N type impurities 16 will overcompensate for the P type impurity and the material will be N with a rapidly changing resistivity which would convert to P type if the layer was continued thick enough. The growth is stopped while the entire section over the buried layer 16 is still N type (FIGURE 7). For ultra shallow ultra high frequency circuits, the epitaxial layer might be as thin as 1 micron but 2 to 4 microns are easier to control. The base 24 and emitter 30 diffusions are then done, as usual (FIGURE 8) except that they may be shallower. For very shallow structures, alloyed emitters rather than diffused emitters can be an advantage.

The isolation region may be subjected to the base diffusion to increase the surface concentration and prevent surface inversion, but this is not fundamental to the process.

It is to be understood that N wafers could be used as starting material instead of P. In this case, P diffusions would substitute for N, and vice versa, resulting in PNP structures instead of NPN.

Having thus described the invention, what is claimed is:

1. The method of isolating components of epitaxial integrated circuits which comprises the steps of;

(a) forming a semiconductor wafer of one type of impurity, (b) selectively diffusing an impurity of the opposite type at plural areas thereon, spaced to form isolated areas, (c) growing an epitaxial layer over the entire said wafer, containing said one type of impurity, (d) continuing growing said epitaxial layer to form an outdiffusion completely through said epitaxial layer at each of said isolated areas, (e) stopping growing said epitaxial layer in time to retain an outdiffusion at each of said isolated areas of opposite type impurity, (f) diffusing said one type of impurity within at least one of said isolated areas to form the base of a semiconductor device, and (g) subsequently forming an emitter of said opposite type impurity for at least said one semiconductor device within the area of said base.

2. The method of claim 1 in which said one and said opposite type of impurities are P and N type impurities, respectively.

3. The method of claim 1 in which said one and said opposite type of impurities are N and P type impurities, respectively.

4. The method of claim 1, in which;

(a) the growth of said epitaxial layer is stopped early to provide a layer thin with respect to the thickness of the diffusion of said opposite type, and (b) an emitter is formed by alloying an impurity within the area of said base.

References Cited

UNITED STATES PATENTS

| | | | |
|---|---|---|---|
| 3,149,395 | 9/1964 | Bray et al. | 148—175 XR |
| 3,260,624 | 7/1966 | Wiesner | 148—175 |
| 3,260,902 | 7/1966 | Porter | 148—1.5 |
| 3,293,087 | 12/1966 | Porter | 148—175 |

L. DEWAYNE RUTLEDGE, Primary Examiner

R. A. LESTER, Assistant Examiner

U.S. Cl. X.R.

29—577; 148—174, 177, 191